(12) United States Patent
Alissa et al.

(10) Patent No.: US 12,219,736 B2
(45) Date of Patent: Feb. 4, 2025

(54) SYSTEMS AND METHODS FOR IMMERSION-COOLED DATACENTERS

(71) Applicant: Microsoft Technology Licensing, LLC, Redmond, WA (US)

(72) Inventors: Husam Atallah Alissa, Redmond, WA (US); Ioannis Manousakis, Redmond, WA (US); Nicholas Andrew Keehn, Kirkland, WA (US); Eric C. Peterson, Woodinville, WA (US); Bharath Ramakrishnan, Bellevue, WA (US); Christian L. Belady, Mercer Island, WA (US); Ricardo Gouvea Bianchini, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/410,887

(22) Filed: Jan. 11, 2024

(65) Prior Publication Data

US 2024/0147663 A1 May 2, 2024

Related U.S. Application Data

(63) Continuation of application No. 18/120,728, filed on Mar. 13, 2023, now Pat. No. 11,910,567, which is a
(Continued)

(51) Int. Cl.
*G06F 1/16* (2006.01)
*H05K 5/00* (2006.01)
(Continued)

(52) U.S. Cl.
CPC .......... *H05K 7/203* (2013.01); *H05K 5/0056* (2013.01); *H05K 7/20327* (2013.01); *H05K 7/20345* (2013.01); *H05K 7/20381* (2013.01)

(58) Field of Classification Search
CPC ............... H05K 7/203; H05K 7/20327; H05K 7/20345; H05K 7/20309; H05K 7/20318;
(Continued)

(56) References Cited

U.S. PATENT DOCUMENTS

| | | | | |
|---|---|---|---|---|
| 4,619,316 A | * | 10/1986 | Nakayama | ............ F28F 13/187 257/713 |
| 4,694,378 A | * | 9/1987 | Nakayama | ............ H01L 23/427 174/15.1 |

(Continued)

*Primary Examiner* — Anthony M Haughton
(74) *Attorney, Agent, or Firm* — RAY QUINNEY & NEBEKER P.C.; Paul N. Taylor

(57) ABSTRACT

A liquid-submersible thermal management system includes a cylindrical outer shell and an inner shell positioned in an interior volume of the outer shell. The cylindrical outer shell has a longitudinal axis oriented vertically relative to a direction of gravity, and the inner shell defines an immersion chamber. The liquid-submersible thermal management system a spine positioned inside the immersion chamber and oriented at least partially in a direction of the longitudinal axis with a heat-generating component located in the immersion chamber. A working fluid is positioned in the immersion chamber and at least partially surrounding the heat-generating component. The working fluid receives heat from the heat-generating component.

20 Claims, 5 Drawing Sheets

Related U.S. Application Data continuation of application No. 17/227,208, filed on Apr. 9, 2021, now Pat. No. 11,606,878.

(51) Int. Cl.
*H05K 7/00* (2006.01)
*H05K 7/20* (2006.01)

(58) Field of Classification Search
CPC .. H05K 7/20336; H05K 5/0056; H05K 5/006; H05K 5/0052; H05K 5/0047
See application file for complete search history.

(56) References Cited

U.S. PATENT DOCUMENTS

| | | | | |
|---|---|---|---|---|
| 6,019,167 | A * | 2/2000 | Bishop | H05K 7/203 |
| | | | | 361/677 |
| 8,720,011 | B1 * | 5/2014 | Hsu | G06F 1/1681 |
| | | | | 16/354 |
| 9,351,429 | B2 * | 5/2016 | Shelnutt | H05K 7/203 |
| 9,562,380 | B2 * | 2/2017 | Song | E05D 1/00 |
| 9,606,583 | B2 * | 3/2017 | Ahn | G06F 1/1681 |
| 9,872,415 | B2 * | 1/2018 | Moss | H05K 7/20818 |
| 9,915,981 | B2 * | 3/2018 | Hsu | G06F 1/1652 |
| 10,129,991 | B2 * | 11/2018 | Lin | G06F 1/1652 |
| 10,512,192 | B2 * | 12/2019 | Miyoshi | H01L 21/67109 |
| 2010/0326628 | A1 * | 12/2010 | Campbell | H05K 7/203 |
| | | | | 165/185 |
| 2010/0328889 | A1 * | 12/2010 | Campbell | H05K 7/203 |
| | | | | 361/699 |
| 2014/0123436 | A1 * | 5/2014 | Griffin | G06F 1/1652 |
| | | | | 16/221 |
| 2014/0144206 | A1 * | 5/2014 | Uehlin | G01L 9/0072 |
| | | | | 73/1.15 |
| 2014/0216711 | A1 * | 8/2014 | Shelnutt | F28D 15/0266 |
| | | | | 165/104.19 |
| 2016/0202736 | A1 * | 7/2016 | Huang | G06F 1/1681 |
| | | | | 16/369 |
| 2016/0370828 | A1 * | 12/2016 | Hsu | G06F 1/1652 |
| 2016/0381840 | A1 * | 12/2016 | Peterson | H05K 7/2079 |
| | | | | 62/260 |
| 2017/0061836 | A1 * | 3/2017 | Kim | G06F 1/1626 |
| 2017/0064862 | A1 * | 3/2017 | Miyoshi | H01L 23/32 |
| 2017/0153059 | A1 * | 6/2017 | Boland | B41J 11/0024 |
| 2017/0303443 | A1 * | 10/2017 | Inano | G06F 1/206 |
| 2018/0153059 | A1 * | 5/2018 | Dehlsen | H05K 7/20754 |
| 2022/0248559 | A1 * | 8/2022 | Peterson | H05K 7/20818 |

* cited by examiner

SYSTEMS AND METHODS FOR IMMERSION-COOLED DATACENTERS

CROSS-REFERENCE TO RELATED APPLICATIONS

This application is a continuation of U.S. patent application Ser. No. 18/120,728, filed Mar. 13, 2023, which is a continuation of U.S. patent application Ser. No. 17/227,203, filed Apr. 9, 2021, now U.S. Pat. No. 11,606,878, which are hereby incorporated by reference in their entireties.

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, a liquid-submersible thermal management system includes a cylindrical outer shell and an inner shell positioned in an interior volume of the outer shell. The cylindrical outer shell has a longitudinal axis oriented vertically relative to a direction of gravity, and the inner shell defines an immersion chamber. The liquid-submersible thermal management system a spine positioned inside the immersion chamber and oriented at least partially in a direction of the longitudinal axis with a heat-generating component located in the immersion chamber. A working fluid is positioned in the immersion chamber and at least partially surrounding the heat-generating component. The working fluid receives heat from the heat-generating component.

In some embodiments, a liquid-submersible thermal management system includes a cylindrical outer shell and an inner shell positioned in an interior volume of the outer shell. The cylindrical outer shell has a longitudinal axis oriented vertically relative to a direction of gravity, and the inner shell defines an immersion chamber. The liquid-submersible thermal management system a spine positioned inside the immersion chamber and oriented at least partially in a direction of the longitudinal axis with a heat-generating component located in the immersion chamber. A working fluid is positioned in the immersion chamber and at least partially surrounding the heat-generating component. The working fluid receives heat from the heat-generating component. A spine is oriented in a direction of the longitudinal axis and positioned in the immersion chamber. The spine includes a working fluid conduit configured to flow a liquid phase of the working fluid upward in the cooling chamber. A nozzle is positioned on the working fluid conduit to spray droplets of the liquid phase of the working fluid toward the heat-generating components.

In some embodiments, a liquid-submersible thermal management system includes an outer shell, an inner shell, a heat-generating component, and a liquid working fluid. The outer shell has a longitudinal axis and an opening at a first end of the longitudinal axis. The inner shell is positioned in the interior volume of the outer shell and defines an immersion chamber. The heat-generating component is located in the immersion chamber with the liquid working fluid. The liquid working fluid completely fills the immersion chamber to surround the heat-generating component, such that the working fluid configured to receive heat from the heat-generating component.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. Immersion chambers surround the heat-generating components in or expose the heat-generating components to a liquid working fluid, which conducts heat from the heat-generating components to cool the heat-generating components. As the working fluid absorbs heat from the heat-generating components, the temperature of the working fluid increases. In some embodiments, the working fluid vaporizes, introducing vapor into the liquid of the working fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion tank and a condenser to extract heat from the vapor of the working fluid. The condenser then condenses the vapor phase of the working fluid into a liquid phase and returns the liquid working fluid to the immersion chamber of the immersion tank. In some embodiments, the liquid working fluid absorbs heat from the heat-generating components, and one or more fluid conduits direct the hot liquid working fluid outside of the immersion chamber to a radiator or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system. An ambient liquid has a greater rate of convective transfer compared to a ambient gas, and therefore an immersion cooling system submerged in an ambient liquid may exhaust heat from the immersion cooling system more efficiently and/or without active cooling such as fans or pumps to move the ambient fluid over the immersion cooling system heat exchanger or heat-dispersing elements. In at least one embodiment, an immersion cooling system is submerged underwater, and heat is removed from the heat-generating components by the working fluid before the heat is transferred from the working fluid to the ambient water outside of the immersion cooling system.

Figure 1:
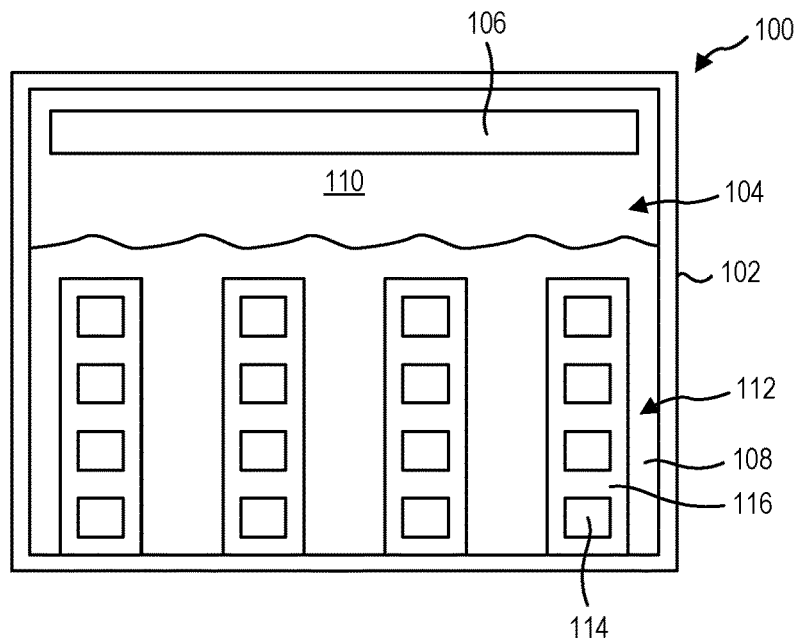
FIG. 1 is a side schematic representation of an immersion cooling system.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
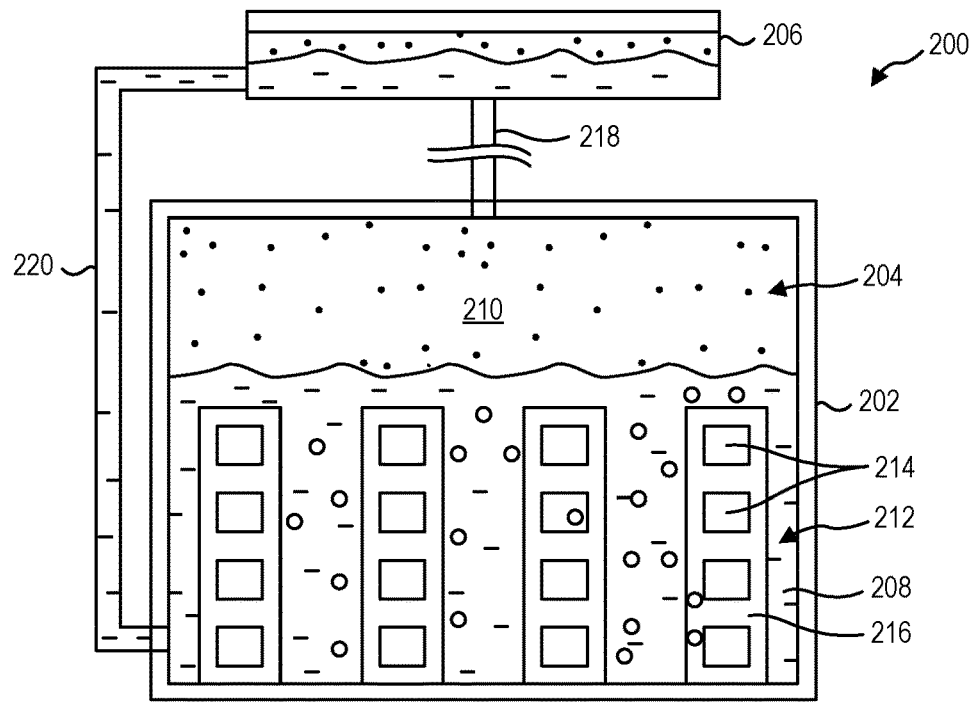
FIG. 2 is a side schematic representation of an immersion cooling system with an external condenser.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

Figure 3:
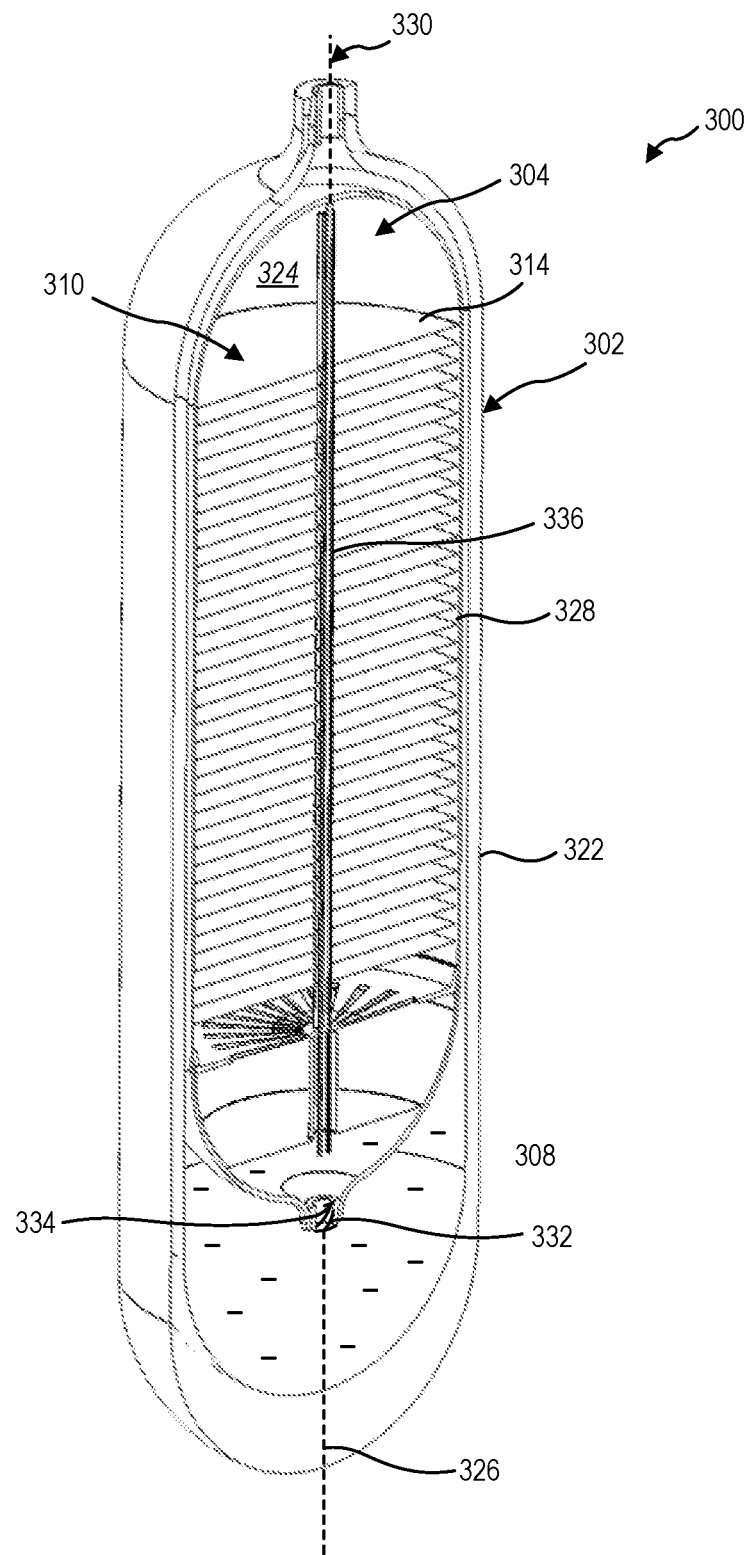
FIG. 3 is a perspective cross-sectional view of an immersion cooling system, according to at least one embodiment of the present disclosure.

In some examples, an immersion cooling system 200 includes an air-cooled condenser 206. An air-cooled condenser 206 may require fans or pumps to force ambient air over one or more heat pipes or fins to conduct heat from the condenser to the air. FIG. 3 is a perspective view of a partial cutaway of an immersion cooling system 300 according to some embodiments of the present disclosure. The immersion tank 302 defines an immersion chamber 304 and the immersion cooling system lacks a conventional condenser. In some embodiments according to the present disclosure, an immersion cooling system 300 cools the vapor using a cold shell 322 of the immersion tank 302. For example, and in contrast of a conventional system, the vapor working fluid 310 is not extracted from the immersion chamber 304 or immersion tank 302, but is rather condensed in the headspace 324 above the surface of the liquid working fluid 308, such that the condensed working fluid falls back into the immersion bath.

In some embodiments, the heat-generating components 314 are positioned in the liquid working fluid 308 with at least a portion of the heat-generating components 314 protruding from the liquid working fluid 308 into the headspace 324. In some embodiments, the heat-generating components 314 are completely submerged in the liquid working fluid 308. While submerging the heat-generating components 314 may allow for efficiency thermal transfer to the liquid working fluid 308, the portion of the heat-generating components 314 that protrudes into the headspace 324 may allow for direct condensation and/or delivery of condensate on the heat-generating components 314. In some embodiments, the liquid working fluid 308 is be sprayed, misted, or jetted onto or toward the heat-generating components 314 to apply the liquid working fluid 308. The heat-generating components 314 may transfer heat to the liquid working fluid 308 to heat and/or vaporize the liquid working fluid 308 in a vapor working fluid 310.

In some embodiments, the liquid working fluid 308 receives heat in a cooling volume of working fluid immediately surrounding the heat-generating components 314. The cooling volume is the region of the working fluid (including both liquid and vapor phases) that is immediately surrounding the heat-generating components 314 and is responsible for the convective cooling of the heat-generating components 314. In some embodiments, the cooling volume is the volume of working fluid within 5 millimeters (mm) of the heat-generating components 314.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

The outer shell 322 is in contact with an ambient liquid around the immersion tank 302 that cools the shell 322.

In a particular example, an immersion cooling system submerged in surface seawater near Seattle, Washington, USA may be surrounded by ambient liquid that remains relatively constant at approximately 40° F. (4.5° C.) to 50° F. (10° C.) throughout the year. Ambient temperatures at depths below the surface (such as 50 meters) may be significantly lower, providing a greater thermal gradient to convectively cool the immersion cooling system 300. Due to the motion of the seawater and the thermal mass of the large amount of seawater around the immersion cooling system 300, the temperature of the ambient liquid may remain substantially unchanged by the waste heat from the immersion cooling system 300.

In some embodiments, the immersion cooling system 300 is internally pressurized against the ambient fluid. For example, the internal pressure of the immersion cooling system 300 may be greater than 1.25 atmospheres. In another example, the internal pressure of the immersion cooling system 300 may be greater than 2.00 atmospheres. In yet another example, the internal pressure of the immersion cooling system 300 may be greater than 5.00 atmospheres.

In some embodiments, the outer shell 322 of the immersion cooling system 300 has a longitudinal axis 326 and a circular cross-section perpendicular to the longitudinal axis 326. For example, the outer shell 322 may be substantially cylindrical. In some embodiments, one or both ends (along the longitudinal axis 326) are rounded. The cylindrical shape and/or rounded ends may allow greater structural strength against compression due to water pressure while submerged or due to pressurization as the working fluid vaporizes.

The outer shell 322 defines an interior volume in which an inner shell 328 is positioned. In some embodiments, the outer shell 322 may have a seam or interface that is coupled to close the outer shell 322 and contain the inner shell 328. In some embodiment, the outer shell 322 is selectively openable as the seam to interface to open the outer shell 322 and access the inner shell 328 or other components of the immersion cooling system 300 contained in the outer shell 322. For example, an upper portion and lower portion of the outer shell 322 may be threaded together at a seam. In another example, an upper portion and lower portion of the outer shell 322 may be bolted together at a seam, such as at a flange interface. In some embodiments, the outer shell may be substantially monolithic and the entire outer shell may be integrally formed without a selectively decouplable seam. In an example, an upper portion and lower portion of the outer shell 322 may be welded together to join the material of the upper portion and lower portion into a single integrally formed shell.

In some embodiments, the outer shell 322 has an outer opening 330 through which communication conduits and/or fluid conduits may enter the interior volume of the outer shell 322. In some embodiments, the inner shell 328 has an inner opening 332 through which communication conduits and/or fluid conduits may enter the immersion chamber 304 of the inner shell 328. The outer opening 330 may allow data communication between computing components housed in the immersion cooling system 300 and a networking device or computing device external to the immersion cooling system 300. The outer opening 330 may allow electrical communication between computing components housed in the immersion cooling system 300 and a power supply external to the immersion cooling system 300. The outer opening 330 may allow fluid communication of working fluid positioned in the inner shell 328 and a reservoir or source external to the immersion cooling system 300.

The outer opening 330 and the inner opening 332 are, in some embodiments, positioned at opposite ends of the outer shell 322 and inner shell 328, respectively. Orienting the openings in opposite directions may limit the ingress of water or other ambient fluid from the exterior of the immersion cooling system 300 into the interior volume of the outer shell 322 and/or the immersion chamber 304 of the inner shell 328. In some embodiments, working fluid is introduced into the interior volume of the outer shell 322 to convectively cool the inner shell 328 and condense the vapor working fluid 310 therein. In some embodiments, ambient fluid, such as seawater, is introduced into the interior volume of the outer shell 322 to convectively cool the inner shell 328 and condense the vapor working fluid 310 therein. In at least one embodiment, the inner opening 334 includes a seal 334 that separates the working fluid in the immersion chamber 304 from contamination by the seawater or other fluid in the interior volume of the outer shell 322.

In some embodiments, the inner shell 328 includes a spine 336 that is oriented at least partially in the direction of the longitudinal axis 326. For example, the spine 336 is illustrated in FIG. 3 as being coaxial with the longitudinal axis 326 of the immersion cooling system 300. In other examples, the spine 336 may be parallel to the longitudinal axis 326 but offset from the longitudinal axis 326. In yet other examples, the spine 336 may be oriented at an angle to the longitudinal axis 326 but have at least a component of its length in the direction of the longitudinal axis 326. In yet another example, the spine 336 may spiral in the direction of the longitudinal axis 326.

The spine 336 may support one or more heat-generating components 314 that operate in the immersion chamber 304. In some embodiments, the spine 336 supports one or more heat-generating components 314 in addition to an inner wall of the inner shell 328 supporting the one or more heat-generating components 314. In some embodiments, the spine 336 supports all of the heat-generating components 314 in the immersion chamber 304. The spine 336 may include or support one or more conduits for providing electrical communication to the heat-generating components 314, such as wire connectivity to computing devices. The spine 336 may further include or support one or more fluid conduits for directing the working fluid toward or past the heat-generating components 314 to cycle the working fluid through the immersion chamber 304, as will be described further below.

In some embodiments, the outer opening 330 allows gas into the interior volume of the outer shell 322 to displace liquid therein. The interior volume of the outer shell 322, therefore, may be at least partially a buoyancy chamber 331 that allows the overall buoyancy of the immersion cooling system 300 to be altered to adjust the height at which the immersion cooling system floats (or sinks) in the ambient liquid.

Figure 4:
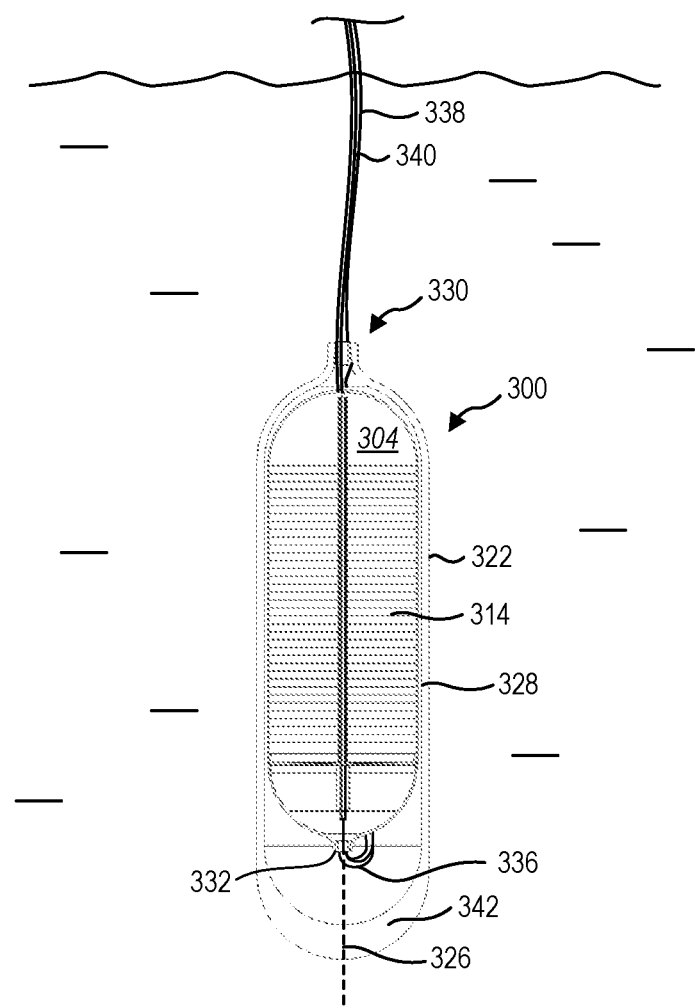
FIG. 4 is a side cross-sectional view of the immersion cooling system of FIG. 3 underwater, according to at least one embodiment of the present disclosure.

For example, FIG. 4 illustrates the embodiment of the immersion cooling system 300 of FIG. 3 underwater. The immersion cooling system 300 is connected to an umbilical pipe 338, which provides at least electrical communication with the immersion cooling system 300 and/or the heat-generating components 314 therein. In some embodiments, the umbilical pipe 338 has therein, at least one electrical conduit 340 to provide electrical communication to the heat-generating components 314. As described herein, the heat-generating components 314 may be server computers or other computing devices that require electricity to operate and data communication to communicate with other electronic devices outside of the immersion cooling system 300.

The umbilical pipe 338 and/or the electrical conduit 340 may enter the immersion cooling system 300 from the outer opening 330. In some embodiments, the umbilical pipe 338 and/or the electrical conduit 340 continues through the interior volume of the outer shell 322 and enter the inner shell 328 through the inner opening 332.

The umbilical pipe 338, in some embodiments, allows cycling of working fluid through the umbilical pipe 338 into the immersion chamber 304 to further cool the heat-generating components 314 therein. Cycling working fluid through the umbilical pipe 338 can expose the working fluid to the high surface area to volume ratio of the umbilical pipe 338 in the ambient liquid, subcooling the working fluid introduced to the immersion chamber 304.

When the immersion cooling system 300 is submerged in a natural body of water, the immersion cooling system 300 may take advantage of naturally occurring fluid flow over the outer shell 322. For example, when the immersion cooling system 300 is submerged in a river, the current of the river may ensure a constant flow of ambient fluid across the outer shell 322. In other examples, when the immersion cooling system 300 is submerged in the ocean, currents and/or tidal forces acting on the local area of the ocean may ensure a constant motion of the ambient fluid across the outer shell 322.

When submerged in fresh water or salt water, the exterior of the immersion cooling system 300 (e.g., the outer shell 322) may experience or be exposed to corrosion from the ambient fluid. In some embodiments, the exterior surface of the outer shell 322 is made of or includes a corrosion resistant material. For example, the outer shell 322 has a corrosion resistant coating, such as a copper nickel coating. In other examples, the outer shell 322 is made of a corrosion resistant material, such as stainless steel.

In some embodiments, the outer shell 322 has an electrical potential applied thereto with a sacrificial anode electrically coupled to the outer shell 322. The sacrificial anode may be coupled directly to the outer shell 322, or the sacrificial anode may be electrically coupled to the outer shell 322 through a wire or other electrical conduit connecting the sacrificial anode and the outer shell 322. In some embodiments, the corrosion resistant materials and/or sacrificial anode of the immersion cooling system 300 can allow the immersion cooling system 300 to remain submerged in an ambient fluid that may, otherwise, corrode at least a portion of the outer shell 322.

In addition to or in the alternative to a buoyancy chamber as described herein, some embodiments of an immersion cooling system 300 may be biased toward a particular orientation in the seawater or other ambient fluid by the inclusion of a ballast 342. For example, a ballast 342 located at a longitudinal end of the immersion cooling system 300 may cause that longitudinal end to preferentially sink, orienting a longitudinal axis 326 of the immersion cooling system 300 in the direction of gravity. In embodiments with an outer opening 330 at the opposite longitudinal end, such as illustrated in FIG. 4, the ballast 342 can keep the outer opening 330 oriented toward the water surface.

Figure 5:
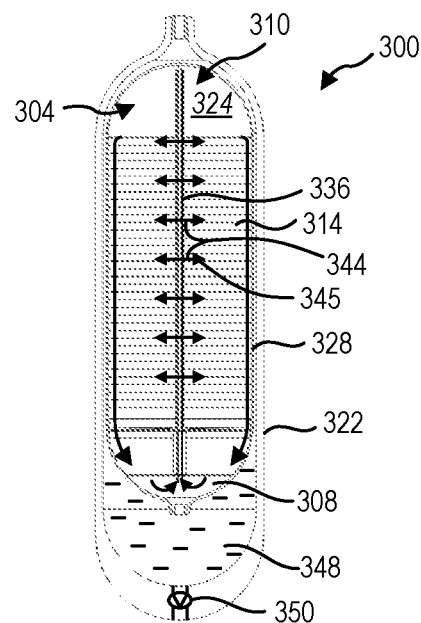
FIG. 5 is a side cross-sectional view of the immersion cooling system of FIG. 3 illustrating a working fluid path, according to at least one embodiment of the present disclosure.

FIG. 5 is a side cross-sectional view of the embodiment of an immersion cooling system of FIG. 3 and FIG. 4. In some embodiments, the liquid working fluid 308 is directed through the spine 336. In some embodiments, the liquid working fluid 308 is directed through a fluid conduit included in or supported by the spine 336. The spine 336 or fluid conduit includes at least one nozzle 344 to direct the liquid working fluid 308 toward the heat-generating components 314. In some embodiments, the spine 336 or fluid conduit includes a plurality of nozzles 344 to distribute the working fluid in the immersion chamber 304. For example, the nozzles 344 may be arranged to direct working fluid between every heat-generating component 314, such as between each circular disc server computer as illustrated in FIG. 5. In some examples, the nozzles 344 may be arranged to direct working fluid between every other heat-generating component 314. In some examples, the nozzles 344 may be arranged to direct working fluid between every third heat-generating component 314. In some examples, the nozzles 344 may be arranged to direct working fluid between at least 20% of the heat-generating components 314.

In some embodiments, the nozzle 344 is positioned below the heat-generating component 344 and the droplets 345 are sprayed upward toward the heat-generating component 314. In some embodiments, the nozzle 344 is positioned above the heat-generating component 314 and the droplets 345 are sprayed downward toward the heat-generating component 314. In some embodiments, the nozzle 344 is positioned laterally from the heat-generating component 314 and the droplets 345 are sprayed laterally toward the heat-generating component 314. The liquid working fluid 308 is pressurized and/or forced through the nozzle 344 by a pump 346. The pump 346 may draw the liquid working fluid 308 from a reservoir and up through the spine 336 and/or fluid conduit to the nozzle 344.

The nozzles 344 may be configured and/or sized to produce droplets 345 of a desired diameter. The nozzles 344 may be adjustable to vary the size of the droplets 345 depending upon desired flowrate through the nozzles 344 and the desired droplet size. In some embodiments, the nozzles 344 create a plurality of droplets 345 with an average droplet diameter of less than 1 millimeter. In some embodiments, the nozzles 344 create a plurality of droplets 345 with an average droplet diameter of less than 0.5 millimeters. In some embodiments, the nozzles 344 create a plurality of droplets 345 with an average droplet diameter of less than 0.25 millimeters. In some embodiments, the nozzles 344 create a plurality of droplets 345 with an average droplet diameter of less than 0.1 millimeters. In some embodiments, the nozzles 344 sprays the subcooled working fluid onto another component, such as a fan, which further disrupts the surface tension and creates the droplets 345 and/or more droplets.

The heat-generating components 314 positioned in the immersion chamber 304 heat the liquid working fluid 308 to a boiling temperature. The liquid working fluid 308 vaporizes. In some embodiments, the vapor working fluid 310 is urged away from the spine 336 toward the inner shell 328 by the spray from the nozzles 344. In some embodiments in which the immersion chamber is filled with liquid working fluid to surround at least one heat-generating component 314, bubbles of the vapor working fluid 310 rise out of the liquid working fluid 308. The hot vapor working fluid 310 continues to rise toward the headspace 324 of the immersion chamber 304 and to the upper portion of the inner shell 328.

In some embodiments, the heat from the hot vapor working fluid 310 is transferred to the inner shell 328 through convective cooling, and the inner shell 328 conducts the heat into the fluid 348 in the interior volume of the outer shell 322. In some embodiments, the fluid 348 is also working fluid. In some embodiments, the fluid 348 is or includes ambient fluid, such as seawater. It may be desirable to purge the fluid 348 from the interior volume of the outer shell 322 to exhaust heat and/or to purge ambient fluid from the working fluid. For example, the liquid working fluid 308 may be less dense that the seawater in the fluid 348, allowing a bilge pump 350 positioned at the bottom of the outer shell 322 to purge the seawater or other dense contaminant from the fluid 348.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

Figure 6:
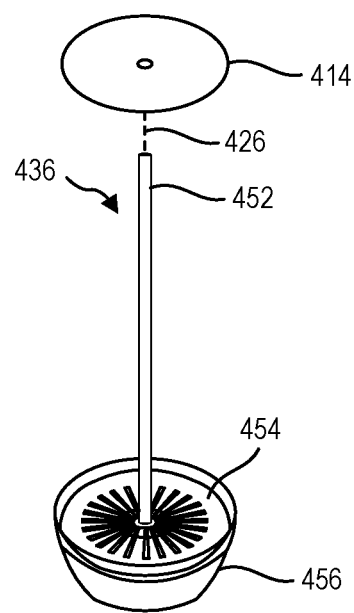
FIG. 6 is a perspective exploded view of a spine and circular server computers of an immersion cooling system, according to at least one embodiment of the present disclosure.

FIG. 6 is an exploded view of another embodiment of a spine 436 with a circular server computer heat-generating component 414. In some embodiments, the spine 436 supports the heat-generating components within the inner shell. The spine 436 may be configured to allow a stack of heat-generating components 414 to slide along the spine 436 in the direction of the longitudinal axis 426 for assembly.

In some embodiments, the spine 436 includes a one or more lobes 452 to limit and/or prevent rotation of the heat-generating components 414 on the spine 436 and/or around the longitudinal axis 426. In some embodiments, the spine 436 includes electrical contacts or other communication interfaces such that each heat-generating component 414 is connected to an electrical conduit in the spine 436 for power and/or communication upon stacking on the spine 436.

The heat-generating component 414 is illustrated in the embodiment of FIG. 6 as a circular server computer with a circular motherboard. The circular heat-generating component 414 allows the computing devices or other electronic components to be shaped complementarily to the transverse cross-section (relative to the longitudinal axis 426) of the inner shell (such as the inner shell 328 described in relation to FIG. 3 through FIG. 5). In other embodiments, the inner shell may have other cross-sectional sectional shapes, and the heat-generating component 414 may have a different shape to substantially match that of the inner shell cross-section. For example, the inner shell cross-section and heat-generating component 414 may be square, rectangular, oval, pentagonal, hexagonal, another regular polygon, an irregular polygon, or combinations thereof.

The spine 436 may further be connected to a drip tray 454 with openings therethrough to receive condensate and/or liquid working fluid that falls down through or around the stack of heat-generating components 414. The condensate and/or liquid working fluid may fall through the openings in the drip tray 454 to collect in a reservoir 456 below. A pump (such as the pump 346 described in relation to FIG. 5) may then extract the liquid working fluid from the reservoir 456.

In some embodiments, the interior surface of the shell 422 and/or the surface of the interior surface features 438 have a condensation texture thereon to further promote condensation of the vapor working fluid 410 on the surfaces. The condensation texture may include dimples, recesses, scoring, striations, scratches, or other uneven surface textures. The uneven surface of the condensation texture may allow for nucleation sites which may reduce the initial energy required to promote condensation from the vapor phase to the liquid phase.

Immersion cooling systems according to the present disclosure may use the cooling capacity of the surrounding ambient fluid to exhaust heat from the working fluid through the shell. In some embodiments, the immersion cooling system employs a two-phase working fluid that transitions between a liquid phase and a vapor phase to transfer heat from the heat-generating components to the ambient fluid. In some embodiments, the immersion cooling system, such as illustrated in FIG. 7, employs a single-phase working fluid that remains in a single phase while transporting heat from the heat-generating components to the ambient fluid around the immersion cooling system.

Figure 7:
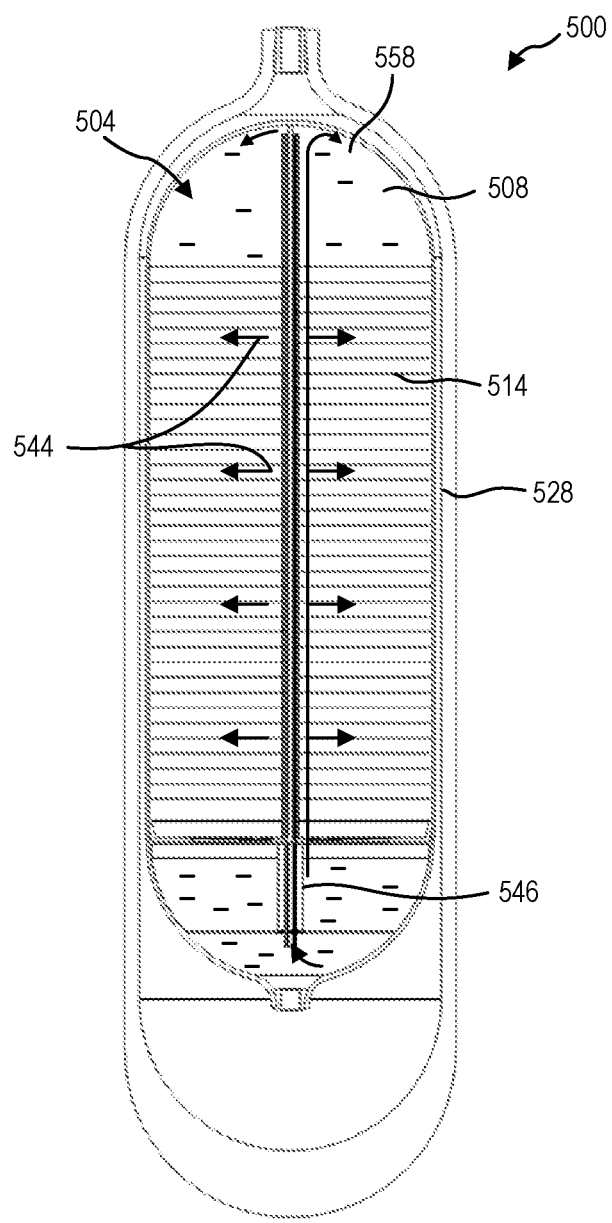
FIG. 7 is a side cross-sectional view of a single-phase immersion cooling system, according to at least one embodiment of the present disclosure.

FIG. 7 is a side cross-sectional view of an immersion cooling system 500. The immersion cooling system 500 includes a liquid working fluid 508 that receives heat from one or more heat-generating components 514. The liquid working fluid 508 absorbs the heat and does not change physical states as the liquid working fluid 508 flows through the immersion chamber 504 of the inner shell 528. In some embodiments, a portion of the heat is transferred from the liquid working fluid 508 to the inner shell 528, which, in turn, exhausts the heat to an interior volume of the outer shell 522 and then to the outer shell 528 to exhaust the heat to the ambient fluid.

The liquid working fluid 508 may circulate through the immersion chamber 504 by flowing up the spine 536 and out through one or more nozzles 544. In some embodiments, the spine 536 lacks nozzles and is open at a distal end 558 from the pump 546. The liquid working fluid 508 receives heat from the heat-generating components 514 as the liquid working fluid 508 circulates. In some embodiments, the single-phase liquid working fluid allows the inner shell 528 to be fluid-tight, further reducing the risk of working fluid leak or seawater ingress. For example, an immersion cooling 500 must compensate for the pressure changes associated with the phase changes between vapor and liquid phases. However, a single-phase working fluid may remain at a stable pressure. Further, in some embodiments, the single-phase working fluid may be an incompressible fluid, such as water, an oil, or a hydrocarbon, supporting the immersion cooling system 500 against the exterior pressure of the ambient fluid.

INDUSTRIAL APPLICABILITY

The present disclosure relates generally to systems and methods for thermal management of electronic devices or other heat-generating components. Immersion chambers surround or partially surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid. The vapor will rise due to buoyancy in the opposite direction of gravity, accumulating in a headspace of the immersion chamber above the immersion bath of liquid working fluid.

An immersion cooling system according to the present disclosure includes an immersion chamber with a working fluid positioned therein. The working fluid transitions between a liquid phase and a vapor phase to remove heat from hot or heat-generating components in the chamber. The liquid phase more efficiency receives heat from the components and, upon transition to the vapor phase, the working fluid can be cooled and condensed to extract the heat from the working fluid before the working fluid is returned to the liquid immersion bath at a lower temperature.

In some embodiments, the immersion bath of the liquid working fluid has a plurality of heat-generating components positioned in the liquid working fluid. The liquid working fluid surrounds the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the working fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor rises in the liquid working fluid, the vapor phase of the working fluid accumulates in an upper vapor region of the chamber. Conventionally, a condenser cools part of the vapor of the working fluid back into a liquid phase, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components. In some embodiments, the cooling volume is the volume of working fluid within 5 mm of the vertical stacks (supports and heat-generating components). In some embodiments, the cooling volume is defined by a vertical cylinder around each of the vertical stacks where no portion of the cylinder is outside 5 mm of the heat-generating components.

The immersion tank defines an immersion chamber and the immersion cooling system lacks a conventional condenser. In some embodiments according to the present disclosure, an immersion cooling system cools the vapor using a cold shell of the immersion tank. For example, and in contrast of a conventional system, the vapor working fluid is not extracted from the immersion chamber or immersion tank but is rather condensed in the headspace above the surface of the liquid working fluid, such that the condensed working fluid falls back into the immersion bath.

In some embodiments, the heat-generating components are positioned in the liquid working fluid with at least a portion of the heat-generating components protruding from the liquid working fluid into the headspace. In some embodiments, the heat-generating components are completely submerged in the liquid working fluid. While submerging the heat-generating components may allow for efficiency thermal transfer to the liquid working fluid, the portion of the heat-generating components that protrudes into the headspace may allow for direct condensation and/or delivery of condensate on the heat-generating components. In some embodiments, the liquid working fluid is be sprayed, misted, or jetted onto or toward the heat-generating components to apply the liquid working fluid. The heat-generating components may transfer heat to the liquid working fluid to heat and/or vaporize the liquid working fluid in a vapor working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

The outer shell is in contact with an ambient liquid around the immersion tank that cools the shell.

In a particular example, an immersion cooling system submerged in surface seawater near Seattle, Washington, USA may be surrounded by ambient liquid that remains relatively constant at approximately 40° F. (4.5° C.) to 50° F. (10° C.) throughout the year. Ambient temperatures at depths below the surface (such as 50 meters) may be significantly lower, providing a greater thermal gradient to convectively cool the immersion cooling system. Due to the motion of the seawater and the thermal mass of the large amount of seawater around the immersion cooling system, the temperature of the ambient liquid may remain substantially unchanged by the waste heat from the immersion cooling system.

In some embodiments, the immersion cooling system is internally pressurized against the ambient fluid. For example, the internal pressure of the immersion cooling system may be greater than 1.25 atmospheres. In another example, the internal pressure of the immersion cooling system may be greater than 2.00 atmospheres. In yet another example, the internal pressure of the immersion cooling system may be greater than 5.00 atmospheres.

In some embodiments, the outer shell of the immersion cooling system has a longitudinal axis and a circular cross-section perpendicular to the longitudinal axis. For example, the outer shell may be substantially cylindrical. In some embodiments, one or both ends (along the longitudinal axis) are rounded. The cylindrical shape and/or rounded ends may allow greater structural strength against compression due to water pressure while submerged or due to pressurization as the working fluid vaporizes.

The outer shell defines an interior volume in which an inner shell is positioned. In some embodiments, the outer shell may have a seam or interface that is coupled to close the outer shell and contain the inner shell. In some embodiment, the outer shell is selectively openable as the seam to interface to open the outer shell and access the inner shell or other components of the immersion cooling system contained in the outer shell. For example, an upper portion and lower portion of the outer shell may be threaded together at a seam. In another example, an upper portion and lower portion of the outer shell may be bolted together at a seam, such as at a flange interface. In some embodiments, the outer shell may be substantially monolithic, and the entire outer shell may be integrally formed without a selectively decouplable seam. In an example, an upper portion and lower portion of the outer shell may be welded together to join the material of the upper portion and lower portion into a single integrally formed shell.

In some embodiments, the outer shell has an outer opening through which communication conduits and/or fluid conduits may enter the interior volume of the outer shell. In some embodiments, the inner shell has an inner opening through which communication conduits and/or fluid conduits may enter the immersion chamber of the inner shell. The outer opening may allow data communication between computing components housed in the immersion cooling system and a networking device or computing device external to the immersion cooling system. The outer opening may allow electrical communication between computing components housed in the immersion cooling system and a power supply external to the immersion cooling system. The outer opening may allow fluid communication of working fluid positioned in the inner shell and a reservoir or source external to the immersion cooling system.

The outer opening and the inner opening are, in some embodiments, positioned at opposite ends of the outer shell and inner shell, respectively. Orienting the openings in opposite directions may limit the ingress of water or other ambient fluid from the exterior of the immersion cooling system into the interior volume of the outer shell and/or the immersion chamber of the inner shell. In some embodiments, working fluid is introduced into the interior volume of the outer shell to convectively cool the inner shell and condense the vapor working fluid therein. In some embodiments, ambient fluid, such as seawater, is introduced into the interior volume of the outer shell to convectively cool the inner shell and condense the vapor working fluid therein. In at least one embodiment, the inner opening includes a seal that separates the working fluid in the immersion chamber from contamination by the seawater or other fluid in the interior volume of the outer shell.

In some embodiments, the inner shell includes a spine that is oriented at least partially in the direction of the longitudinal axis. For example, the spine may be coaxial with the longitudinal axis of the immersion cooling system. In other examples, the spine may be parallel to the longitudinal axis but offset from the longitudinal axis. In yet other examples, the spine may be oriented at an angle to the longitudinal axis but have at least a component of its length in the direction of the longitudinal axis. In yet another example, the spine may spiral in the direction of the longitudinal axis.

The spine may support one or more heat-generating components that operate in the immersion chamber. In some embodiments, the spine supports one or more heat-generating components in addition to an inner wall of the inner shell supporting the one or more heat-generating components. In some embodiments, the spine supports all of the heat-generating components in the immersion chamber. The spine may include or support one or more conduits for providing electrical communication to the heat-generating components, such as wire connectivity to computing devices. The spine may further include or support one or more fluid conduits for directing the working fluid toward or past the heat-generating components to cycle the working fluid through the immersion chamber, as will be described further below.

In some embodiments, the outer opening allows gas into the interior volume of the outer shell to displace liquid therein. The interior volume of the outer shell, therefore, may be at least partially a buoyancy chamber that allows the overall buoyancy of the immersion cooling system to be altered to adjust the height at which the immersion cooling system floats (or sinks) in the ambient liquid.

The immersion cooling system may be connected to an umbilical pipe, which provides at least electrical communication with the immersion cooling system and/or the heat-generating components therein. In some embodiments, the umbilical pipe has therein, at least one electrical conduit to provide electrical communication to the heat-generating components. As described herein, the heat-generating components may be server computers or other computing devices that require electricity to operate and data communication to communicate with other electronic devices outside of the immersion cooling system.

The umbilical pipe and/or the electrical conduit may enter the immersion cooling system from the outer opening. In some embodiments, the umbilical pipe and/or the electrical conduit continues through the interior volume of the outer shell and enter the inner shell through the inner opening.

The umbilical pipe, in some embodiments, allows cycling of working fluid through the umbilical pipe into the immersion chamber to further cool the heat-generating components therein. Cycling working fluid through the umbilical pipe can expose the working fluid to the high surface area to volume ratio of the umbilical pipe in the ambient liquid, subcooling the working fluid introduced to the immersion chamber.

When the immersion cooling system is submerged in a natural body of water, the immersion cooling system may take advantage of naturally occurring fluid flow over the outer shell. For example, when the immersion cooling system is submerged in a river, the current of the river may ensure a constant flow of ambient fluid across the outer shell. In other examples, when the immersion cooling system is submerged in the ocean, currents and/or tidal forces acting on the local area of the ocean may ensure a constant motion of the ambient fluid across the outer shell.

When submerged in fresh water or salt water, the exterior of the immersion cooling system (e.g., the outer shell) may experience or be exposed to corrosion from the ambient fluid. In some embodiments, the exterior surface of the outer shell is made of or includes a corrosion resistant material. For example, the outer shell has a corrosion resistant coating, such as a copper nickel coating. In other examples, the outer shell is made of a corrosion resistant material, such as stainless steel.

In some embodiments, the outer shell has an electrical potential applied thereto with a sacrificial anode electrically coupled to the outer shell. The sacrificial anode may be coupled directly to the outer shell, or the sacrificial anode may be electrically coupled to the outer shell through a wire or other electrical conduit connecting the sacrificial anode and the outer shell. In some embodiments, the corrosion resistant materials and/or sacrificial anode of the immersion cooling system can allow the immersion cooling system to remain submerged in an ambient fluid that may, otherwise, corrode at least a portion of the outer shell.

In addition to or in the alternative to a buoyancy chamber as described herein, some embodiments of an immersion cooling system may be biased toward a particular orientation in the seawater or other ambient fluid by the inclusion of a ballast. For example, a ballast located at a longitudinal end of the immersion cooling system may cause that longitudinal end to preferentially sink, orienting a longitudinal axis of the immersion cooling system in the direction of gravity. In embodiments with an outer opening at the opposite longitudinal end, the ballast can keep the outer opening oriented toward the water surface.

In some embodiments, the liquid working fluid is directed through the spine. In some embodiments, the liquid working fluid is directed through a fluid conduit included in or supported by the spine. The spine or fluid conduit includes at least one nozzle to direct the liquid working fluid toward the heat-generating components. In some embodiments, the spine or fluid conduit includes a plurality of nozzles to distribute the working fluid in the immersion chamber. For example, the nozzles may be arranged to direct working fluid between every heat-generating component, such as between each circular disc server computer. In some examples, the nozzles may be arranged to direct working fluid between every other heat-generating component. In some examples, the nozzles may be arranged to direct working fluid between every third heat-generating component. In some examples, the nozzles may be arranged to direct working fluid between at least 20% of the heat-generating components.

In some embodiments, the nozzle is positioned below the heat-generating component and the droplets are sprayed upward toward the heat-generating component. In some embodiments, the nozzle is positioned above the heat-generating component and the droplets are sprayed downward toward the heat-generating component. In some embodiments, the nozzle is positioned laterally from the heat-generating component and the droplets are sprayed laterally toward the heat-generating component. The liquid working fluid is pressurized and/or forced through the nozzle by a pump. The pump may draw the liquid working fluid from a reservoir and up through the spine and/or fluid conduit to the nozzle.

The nozzles may be configured and/or sized to produce droplets of a desired diameter. The nozzles may be adjustable to vary the size of the droplets depending upon desired flowrate through the nozzles and the desired droplet size. In some embodiments, the nozzles create a plurality of droplets with an average droplet diameter of less than 1 millimeter. In some embodiments, the nozzles create a plurality of droplets with an average droplet diameter of less than 0.5 millimeters. In some embodiments, the nozzles create a plurality of droplets with an average droplet diameter of less than 0.25 millimeters. In some embodiments, the nozzles create a plurality of droplets with an average droplet diameter of less than 0.1 millimeters. In some embodiments, the nozzles sprays the subcooled working fluid onto another component, such as a fan, which further disrupts the surface tension and creates the droplets and/or more droplets.

The heat-generating components positioned in the immersion chamber heat the liquid working fluid to a boiling temperature. The liquid working fluid vaporizes. In some embodiments, the vapor working fluid is urged away from the spine toward the inner shell by the spray from the nozzles. In some embodiments in which the immersion chamber is filled with liquid working fluid to surround at least one heat-generating component, bubbles of the vapor working fluid rise out of the liquid working fluid. The hot vapor working fluid continues to rise toward the headspace of the immersion chamber and to the upper portion of the inner shell.

In some embodiments, the heat from the hot vapor working fluid is transferred to the inner shell through convective cooling, and the inner shell conducts the heat into the fluid in the interior volume of the outer shell. In some embodiments, the fluid is also working fluid. In some embodiments, the fluid is or includes ambient fluid, such as seawater. It may be desirable to purge the fluid from the interior volume of the outer shell to exhaust heat and/or to purge ambient fluid from the working fluid. For example, the liquid working fluid may be less dense that the seawater in the fluid, allowing a bilge pump positioned at the bottom of the outer shell to purge the seawater or other dense contaminant from the fluid.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

In some embodiments, the spine supports the heat-generating components within the inner shell. The spine may be configured to allow a stack of heat-generating components to slide along the spine in the direction of the longitudinal axis for assembly.

In some embodiments, the spine includes a one or more lobes to limit and/or prevent rotation of the heat-generating components on the spine and/or around the longitudinal axis. In some embodiments, the spine includes electrical contacts or other communication interfaces such that each heat-generating component is connected to an electrical conduit in the spine for power and/or communication upon stacking on the spine.

The heat-generating component may be a circular server computer with a circular motherboard. The circular heat-generating component allows the computing devices or other electronic components to be shaped complementarily to the transverse cross-section (relative to the longitudinal axis) of the inner shell. In other embodiments, the inner shell may have other cross-sectional sectional shapes, and the heat-generating component may have a different shape to substantially match that of the inner shell cross-section. For example, the inner shell cross-section and heat-generating component may be square, rectangular, oval, pentagonal, hexagonal, another regular polygon, an irregular polygon, or combinations thereof.

The spine may further be connected to a drip tray with openings therethrough to receive condensate and/or liquid working fluid that falls down through or around the stack of heat-generating components. The condensate and/or liquid working fluid may fall through the openings in the drip tray to collect in a reservoir below. A pump may then extract the liquid working fluid from the reservoir.

In some embodiments, the interior surface of the shell and/or the surface of the interior surface features have a condensation texture thereon to further promote condensation of the vapor working fluid on the surfaces. The condensation texture may include dimples, recesses, scoring, striations, scratches, or other uneven surface textures. The uneven surface of the condensation texture may allow for nucleation sites which may reduce the initial energy required to promote condensation from the vapor phase to the liquid phase.

Immersion cooling systems according to the present disclosure may use the cooling capacity of the surrounding ambient fluid to exhaust heat from the working fluid through the shell. In some embodiments, the immersion cooling system employs a two-phase working fluid that transitions between a liquid phase and a vapor phase to transfer heat from the heat-generating components to the ambient fluid. In some embodiments, the immersion cooling system employs a single-phase working fluid that remains in a single phase while transporting heat from the heat-generating components to the ambient fluid around the immersion cooling system.

The immersion cooling system includes a liquid working fluid that receives heat from one or more heat-generating components. The liquid working fluid absorbs the heat and does not change physical states as the liquid working fluid flows through the immersion chamber of the inner shell. In some embodiments, a portion of the heat is transferred from the liquid working fluid to the inner shell, which, in turn, exhausts the heat to an interior volume of the outer shell and then to the outer shell to exhaust the heat to the ambient fluid.

The liquid working fluid may circulate through the immersion chamber by flowing up the spine and out through one or more nozzles. In some embodiments, the spine lacks nozzles and is open at a distal end from the pump. The liquid working fluid receives heat from the heat-generating components as the liquid working fluid circulates. In some embodiments, the single-phase liquid working fluid allows the inner shell to be fluid-tight. For example, an immersion cooling must compensate for the pressure changes associated with the phase changes between vapor and liquid phases. However, a single-phase working fluid may remain at a stable pressure. Further, in some embodiments, the single-phase working fluid may be an incompressible fluid, supporting the immersion cooling system against the exterior pressure of the ambient fluid.

The present disclosure relates to systems and methods for cooling heat-generating components of a computer or computing device according to at least the examples provided in the sections below:

- (A1) In some embodiments, a liquid-submersible thermal management system includes a cylindrical outer shell and an inner shell positioned in an interior volume of the outer shell. The cylindrical outer shell has a longitudinal axis oriented vertically relative to a direction of gravity, and the inner shell defines an immersion chamber. The liquid-submersible thermal management system a spine positioned inside the immersion chamber and oriented at least partially in a direction of the longitudinal axis with a heat-generating component located in the immersion chamber. A working fluid is positioned in the immersion chamber and at least partially surrounding the heat-generating component. The working fluid receives heat from the heat-generating component.
- (A2) In some embodiments, the working fluid of (A1) has a boiling temperature less than 90° C.
- (A3) In some embodiments, the exterior surface of the outer shell of (A1) or (A2) is corrosion resistant.
- (A4) In some embodiments, a liquid phase of the working fluid of any of (A1) through (A3) fills an entire volume of the immersion chamber around the heat-generating component.
- (A5) In some embodiments, a thermal management system of any of (A1) through (A4) includes a bilge pump to displace a fluid from the interior volume of the outer shell and adjust buoyancy of the system.
- (A6) In some embodiments, the heat-generating component of any of (A1) through (A5) is a disc server blade.
- (A7) In some embodiments, the inner shell of any of (A1) through (A6) is cylindrical and shares the longitudinal axis with the outer shell.
- (A8) In some embodiments, the spine of any of (A1) through (A7) the spine includes a working fluid conduit oriented in a direction of the longitudinal axis and configured to flow a liquid phase of the working fluid upward in the cooling chamber.
- (A9) In some embodiments, a thermal management system of any of (A1) through (A8) includes a ballast positioned on or in a bottom of the outer shell to orient the longitudinal axis in the direction of gravity.
- (A10) In some embodiments, a thermal management system of any of (A1) through (A9) includes a surface fluid conduit connected to an opening of the outer shell and providing fluid communication into the interior volume of the outer shell.
- (A11) In some embodiments, the spine of any of (A1) through (A10) supports the heat-generating component.
- (A12) In some embodiments, a liquid-submersible thermal management system includes a cylindrical outer shell and an inner shell positioned in an interior volume of the outer shell. The cylindrical outer shell has a longitudinal axis oriented vertically relative to a direction of gravity, and the inner shell defines an immersion chamber. The liquid-submersible thermal management system a spine positioned inside the immersion chamber and oriented at least partially in a direction of the longitudinal axis with a heat-generating component located in the immersion chamber. A working fluid is positioned in the immersion chamber and at least partially surrounding the heat-generating component. The working fluid receives heat from the heat-generating component. A spine is oriented in a direction of the longitudinal axis and positioned in the immersion chamber. The spine includes a working fluid conduit configured to flow a liquid phase of the working fluid upward in the cooling chamber. A nozzle is positioned on the working fluid conduit to spray droplets of the liquid phase of the working fluid toward the heat-generating components.
- (A13) In some embodiments, the nozzle of (A12) provides the liquid phase in droplets less than 5.0 mm in diameter.
- (A14) In some embodiments, the thermal management system of (A12) or (A13) includes a fluid pump to force the liquid phase through the nozzle.
- (A15) In some embodiments, an interior pressure of the working fluid of any of (A12) through (A14) is greater than 1.25 atmospheres.
- (A16) In some embodiments, a liquid-submersible thermal management system includes an outer shell, an inner shell, a heat-generating component, and a liquid working fluid. The outer shell has a longitudinal axis and an opening at a first end of the longitudinal axis. The inner shell is positioned in the interior volume of the outer shell and defines an immersion chamber. The heat-generating component is located in the immersion chamber with the liquid working fluid. The liquid working fluid completely fills the immersion chamber to surround the heat-generating component, such that the working fluid configured to receive heat from the heat-generating component.
- (A17) In some embodiments, the thermal management system of (A16) further comprises a heat exchanger, a first fluid conduit, and a second fluid conduit. The first fluid conduit provides fluid communication between a hot fluid pickup at a first side of the cooling chamber and the heat exchanger. The second fluid conduit provides fluid communication between the heat exchanger and a fluid return at a second side of the cooling chamber.
- (A18) In some embodiments, the heat exchanger of (A17) is external to the inner shell.
- (A19) In some embodiments, the heat exchanger of (A17) or (A18) is a liquid-cooled heat exchanger.
- (A20) In some embodiments, the liquid working fluid of any of (A16) through (A19) is a hydrocarbon.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
   an immersion tank including an outer shell configured to be surrounded at least partially by ambient liquid;
   an inner shell positioned in an interior volume of the outer shell, the inner shell defining an immersion chamber; and
   a heat-generating component located in the immersion chamber, the immersion chamber configured to contain a working fluid.

2. The thermal management system of claim 1, wherein the heat-generating component is positioned in the working fluid on one or more supports.

3. The thermal management system of claim 2, wherein the one or more supports are thermally conductive and configured to conduct heat from the heat-generating component.

4. The thermal management system of claim 1, wherein a liquid phase of the working fluid fills an entire volume of the immersion chamber around the heat-generating component.

5. The thermal management system of claim 1, further including nucleation sites defined by a texture of one or more of an interior surface of the inner shell, the heat-generating component, and a spine of the inner shell.

6. The thermal management system of claim 1, wherein the heat-generating component is a disc server blade.

7. The thermal management system of claim 1, wherein the working fluid includes one or more of water, oil, a hydrocarbon, glycol, an aqueous solution, or an electronic liquid.

8. The thermal management system of claim 1, further including one or more sensors.

9. The thermal management system of claim 8, wherein the one or more sensors are configured to monitor one or more of flowrate, pressure, temperature, or density of the working fluid.

10. The thermal management system of claim 1, further comprising a surface fluid conduit connected to an opening of the outer shell and providing fluid communication into the interior volume of the outer shell.

11. The thermal management system of claim 1, wherein the working fluid is further configured to transfer heat from the working fluid to the inner shell through convective cooling.

12. A liquid-submersible thermal management system comprising:
    an immersion tank including an outer shell;
    an inner shell positioned in an interior volume of the outer shell, the inner shell defining an immersion chamber;
    a heat-generating component located in the immersion chamber, the immersion chamber configured to contain a working fluid; and
    a nozzle positioned on a working fluid conduit and configured to direct droplets of a liquid phase of the working fluid toward the heat-generating component.

13. The liquid-submersible thermal management system of claim 12, wherein the nozzle is configured to size the liquid phase in droplets less than 0.5 mm in diameter.

14. The liquid-submersible thermal management system of claim 12, further comprising a fluid pump configured to force the liquid phase through the nozzle.

15. The liquid-submersible thermal management system of claim 12, wherein the outer shell is configured to contact with an ambient liquid for cooling off the outer shell.

16. A thermal management system comprising:
    an immersion tank including an outer shell surrounded at least partially by ambient fluid;
    an inner shell positioned in an interior volume of the outer shell, the inner shell defining an immersion chamber;
    a buoyancy chamber located between the outer shell and the inner shell and configured to receive a ballast; and
    a heat-generating component located in the immersion chamber, the immersion chamber configured to contain a working fluid.

17. The thermal management system of claim 16, wherein the buoyancy chamber is located at a first end of the immersion tank.

18. The thermal management system of claim 17, further including an outer opening at an opposite end of the immersion tank from the buoyancy chamber at the first end.

19. The thermal management system of claim 18, further comprising a surface fluid conduit connected to the outer opening of the immersion tank and providing fluid communication into the interior volume of the outer shell.

20. The thermal management system of claim 16, wherein an exterior surface of the outer shell is corrosion resistant.

* * * * *